United States Patent
Ranganathan et al.

(10) Patent No.: US 8,018,361 B2
(45) Date of Patent: Sep. 13, 2011

(54) AREA-EFFICIENT ANALOG-TO-DIGITAL CONVERTER

(75) Inventors: Sumant Ranganathan, Sunnyvale, CA (US); Tom Kwan, Cupertino, CA (US); Xinyu Yu, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/615,868

(22) Filed: Nov. 10, 2009

(65) Prior Publication Data

US 2010/0176977 A1     Jul. 15, 2010

Related U.S. Application Data

(60) Provisional application No. 61/143,929, filed on Jan. 12, 2009.

(51) Int. Cl.
*H03M 1/00* (2006.01)

(52) U.S. Cl. .................................. 341/122; 341/161

(58) Field of Classification Search .............. 341/144, 341/155, 161, 172, 122
See application file for complete search history.

(56) References Cited

U.S. PATENT DOCUMENTS

| 6,396,429 B2* | 5/2002 | Singer et al. | 341/155 |
| 7,265,705 B1* | 9/2007 | Lee et al. | 341/162 |
| 7,551,113 B2* | 6/2009 | Wu et al. | 341/150 |

* cited by examiner

*Primary Examiner* — Brian Young
(74) *Attorney, Agent, or Firm* — Sterne, Kessler, Goldstein & Fox PLLC

(57) ABSTRACT

The present invention relates generally to analog-to-digital converters (ADCs). Embodiments of the present invention provide novel ADC architectures directed at reducing the overall ADC area and power consumption. Embodiments of the present invention may be used in pipelined ADCs, cyclic ADCs, and successive approximation (SAR) ADCs, for example. Further, embodiments of the present invention may be implemented using both single-ended and differential configurations.

25 Claims, 11 Drawing Sheets

AREA-EFFICIENT ANALOG-TO-DIGITAL CONVERTER

CROSS-REFERENCE TO RELATED APPLICATIONS

The present application claims the benefit of U.S. Provisional Patent Application No. 61/143,929, filed Jan. 12, 2009, which is incorporated herein by reference in its entirety.

BACKGROUND OF THE INVENTION

1. Field of the Invention

The present invention relates generally to analog-to-digital converters (ADCs).

2. Background Art

Pipeline ADCs, cyclic ADCs, and Successive Approximation (SAR) ADCs are widely used in communication applications that require analog-to-digital converters with high throughput (>10 Megasamples/sec), low latency, and medium resolution (8-14 bits).

However, conventional ADCs are both large in area and high in power consumption. There is a need therefore to reduce the overall ADC area and power requirements.

BRIEF SUMMARY OF THE INVENTION

The present invention relates generally to analog-to-digital converters (ADCs).

Embodiments of the present invention provide novel ADC architectures directed at reducing the overall ADC area and power consumption.

Embodiments of the present invention may be used in pipelined ADCs, cyclic ADCs, and successive approximation (SAR) ADCs, for example. Further, embodiments of the present invention may be implemented using both single-ended and differential configurations.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 4A:
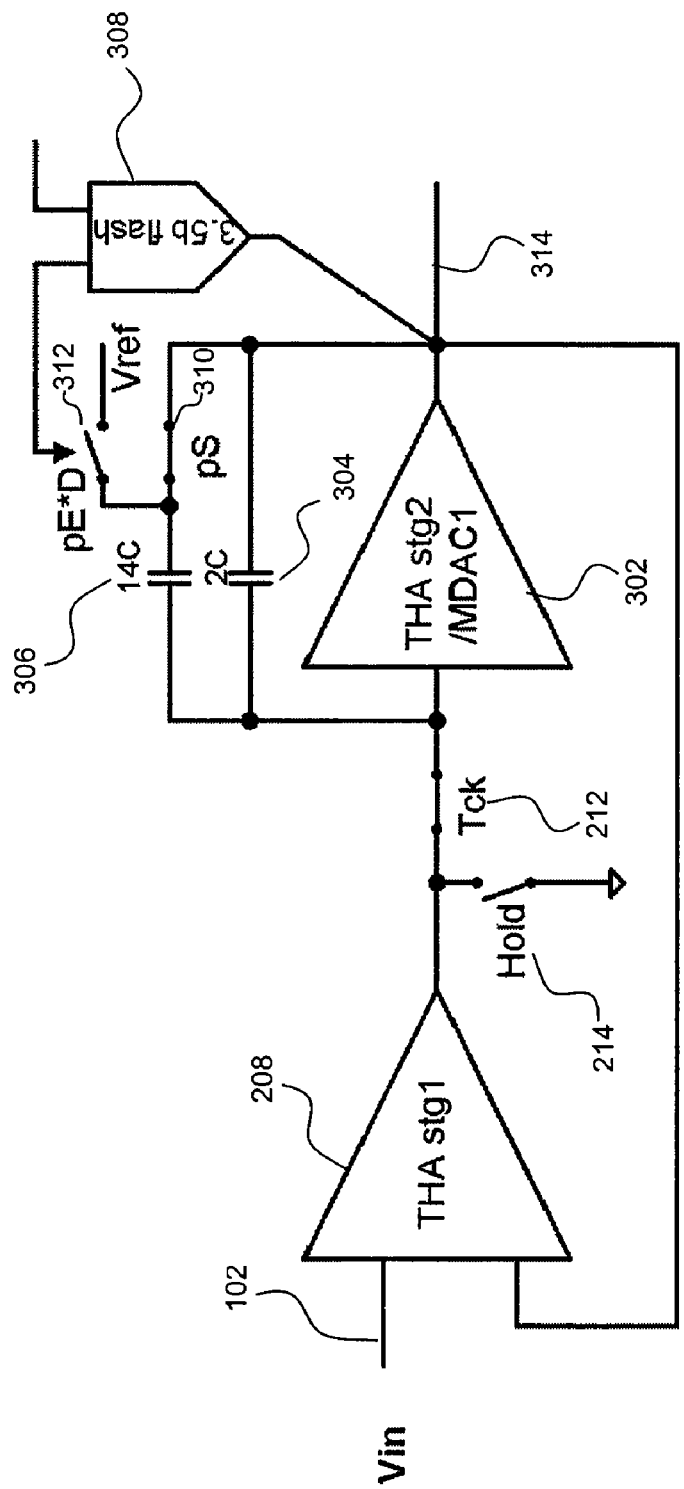
Figure 4B:
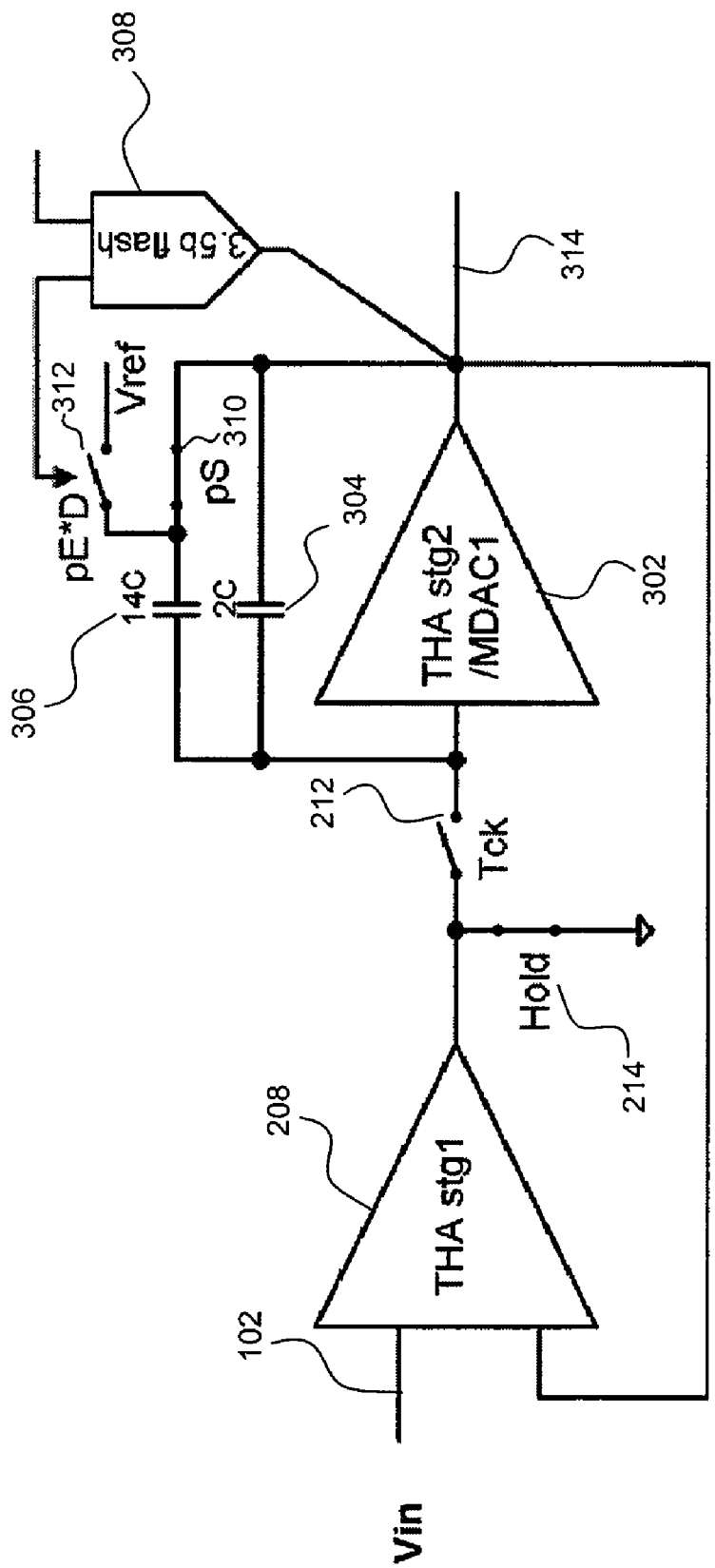
Figure 4C:
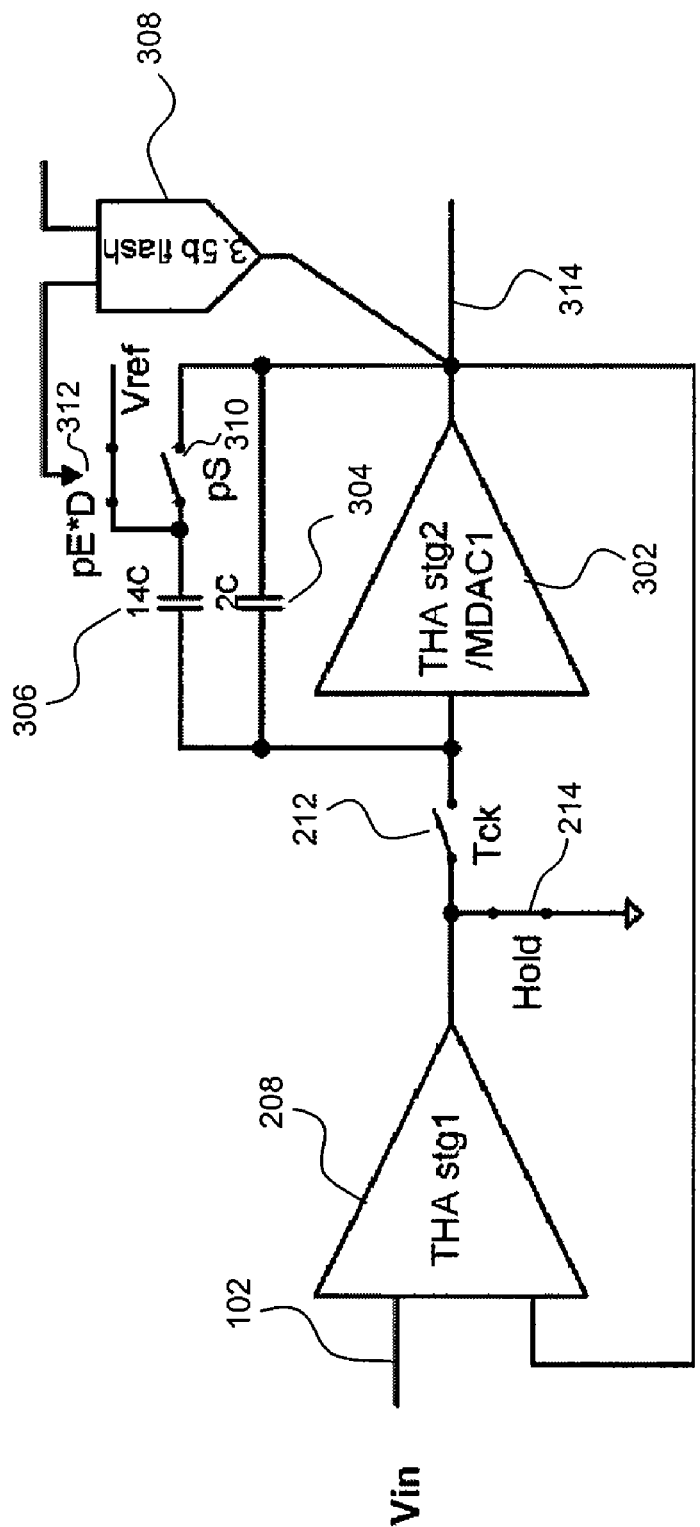

FIGS. 4A-C illustrate the operation of a shared THA/MDAC stage implementation according to an embodiment of the present invention.

Figure 5:
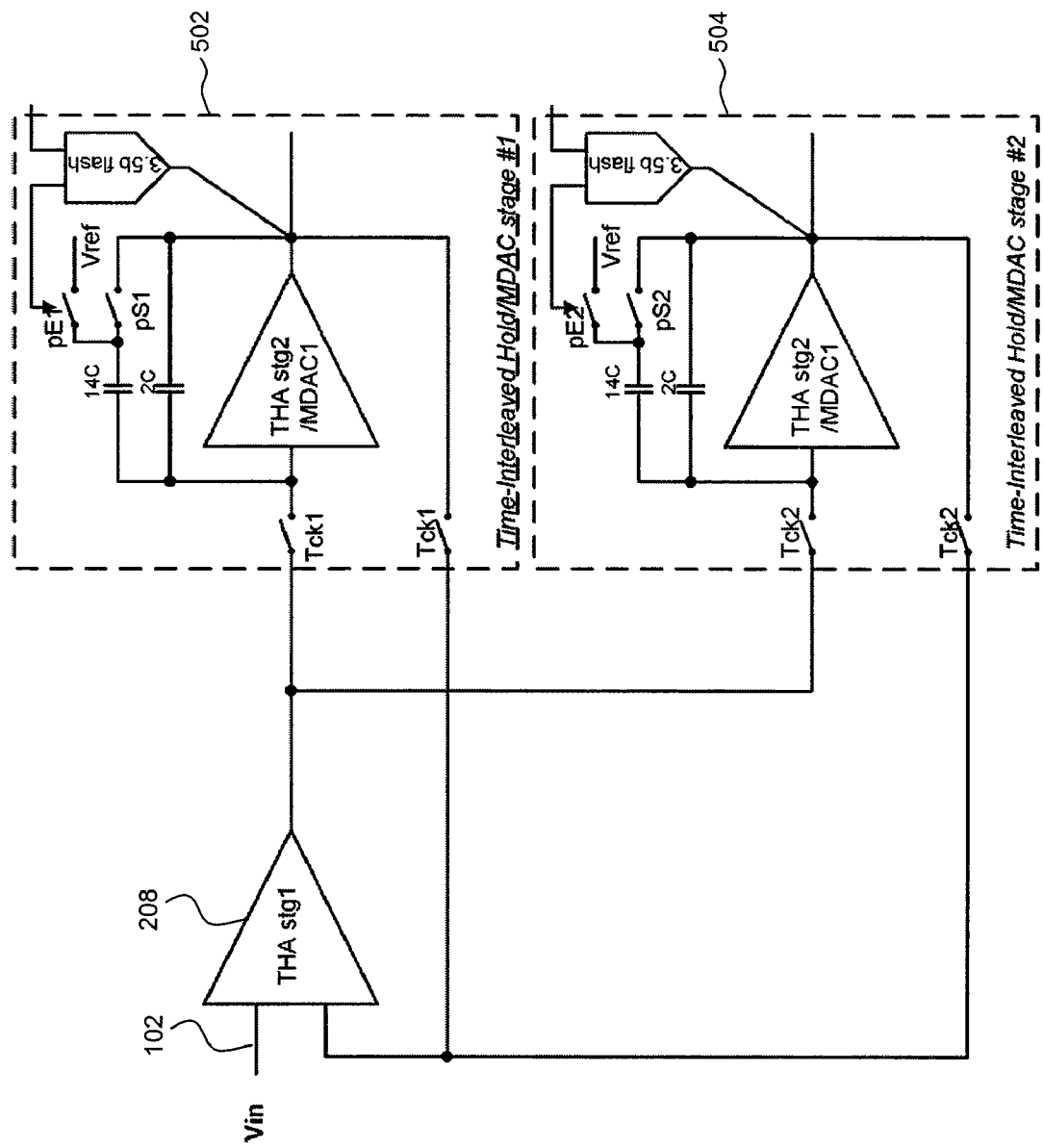

FIG. 5 illustrates an example time-interleaved architecture of a shared THA/MDAC stage implementation according to an embodiment of the present invention.

Figure 6A:
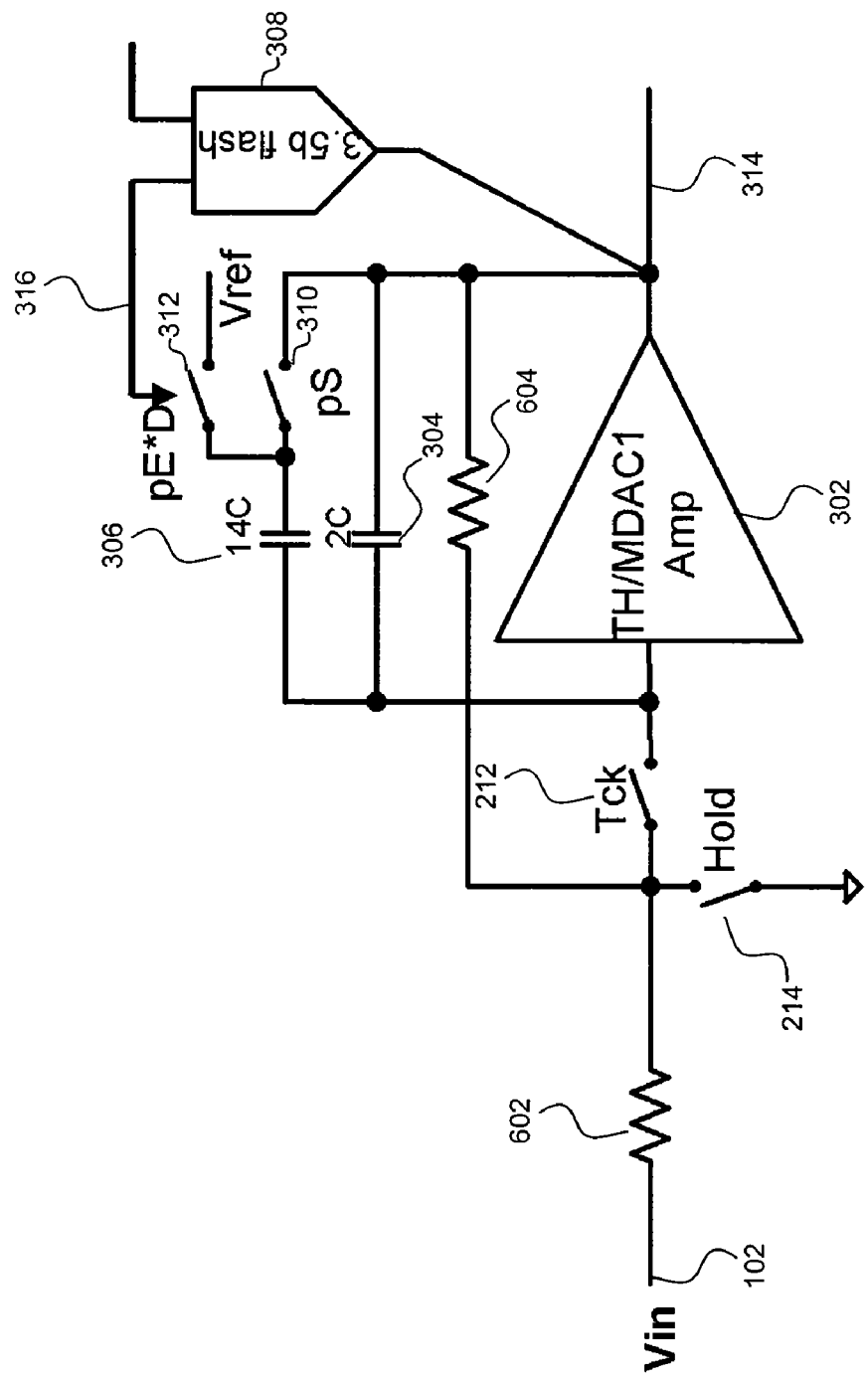
Figure 6B:
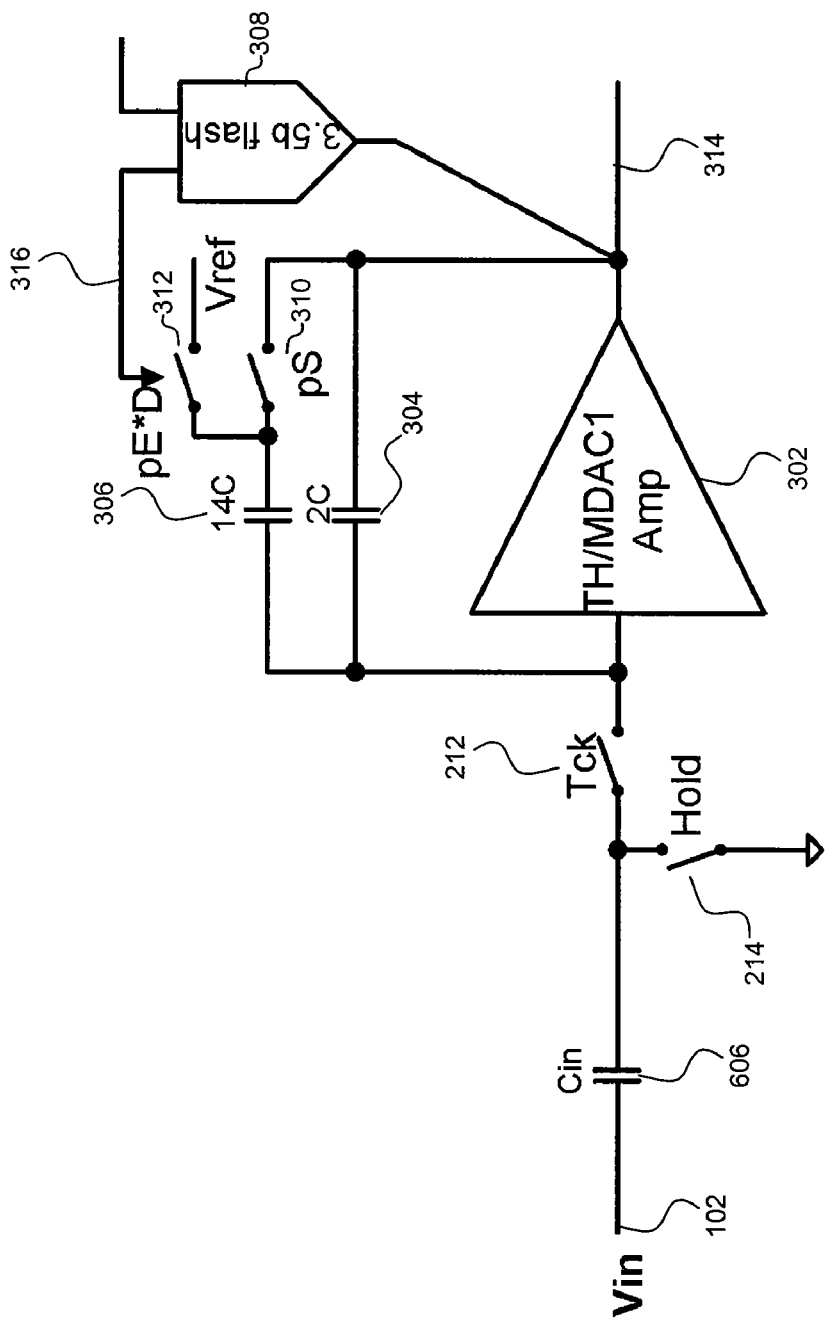

FIGS. 6A-6B illustrate example shared THA/MDAC implementations according to embodiments of the present invention.

Figure 7:
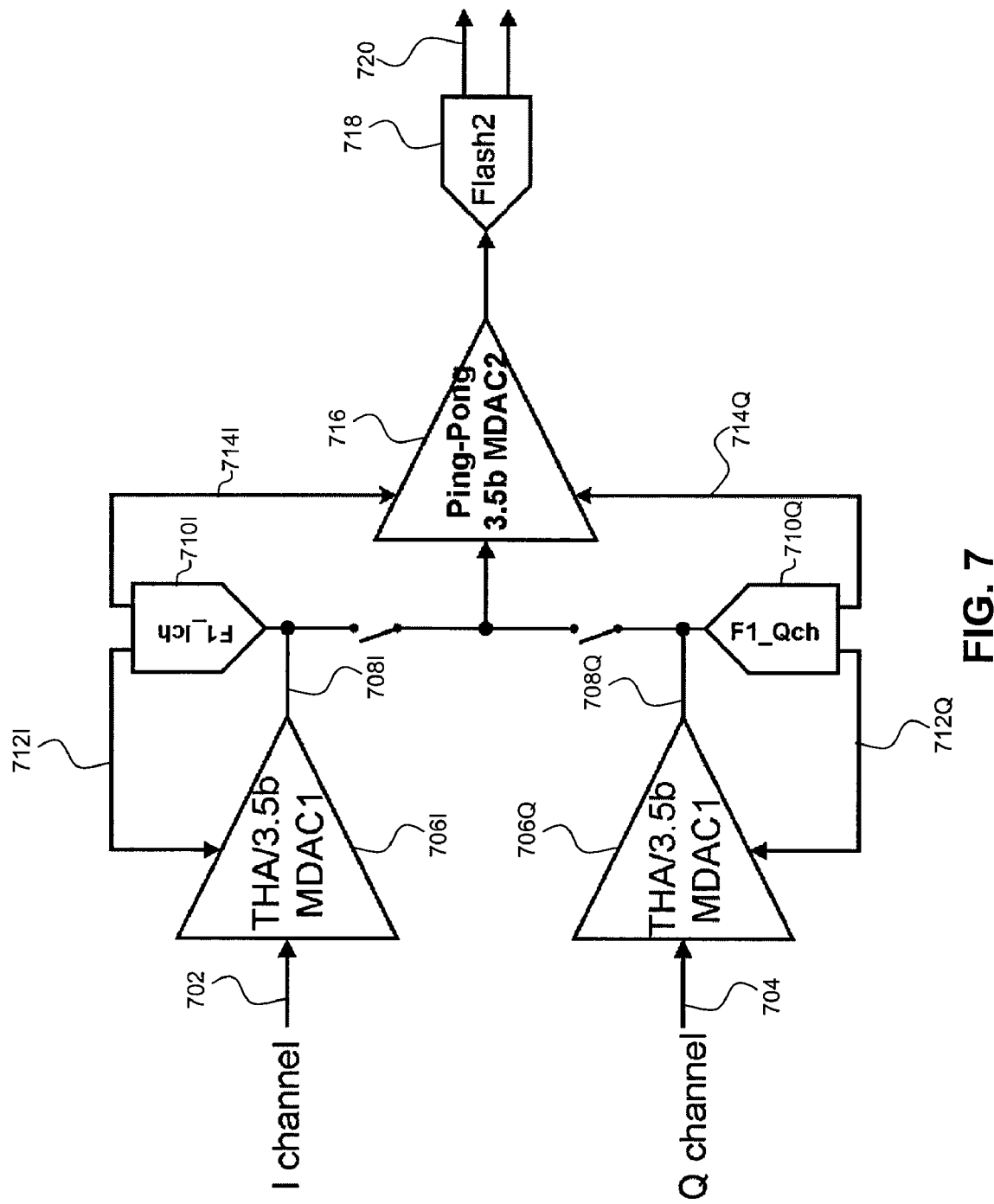

FIG. 7 illustrates an example dual-channel pipeline IQ ADC architecture with shared THA/MDAC stage implementation.

Figure 8:
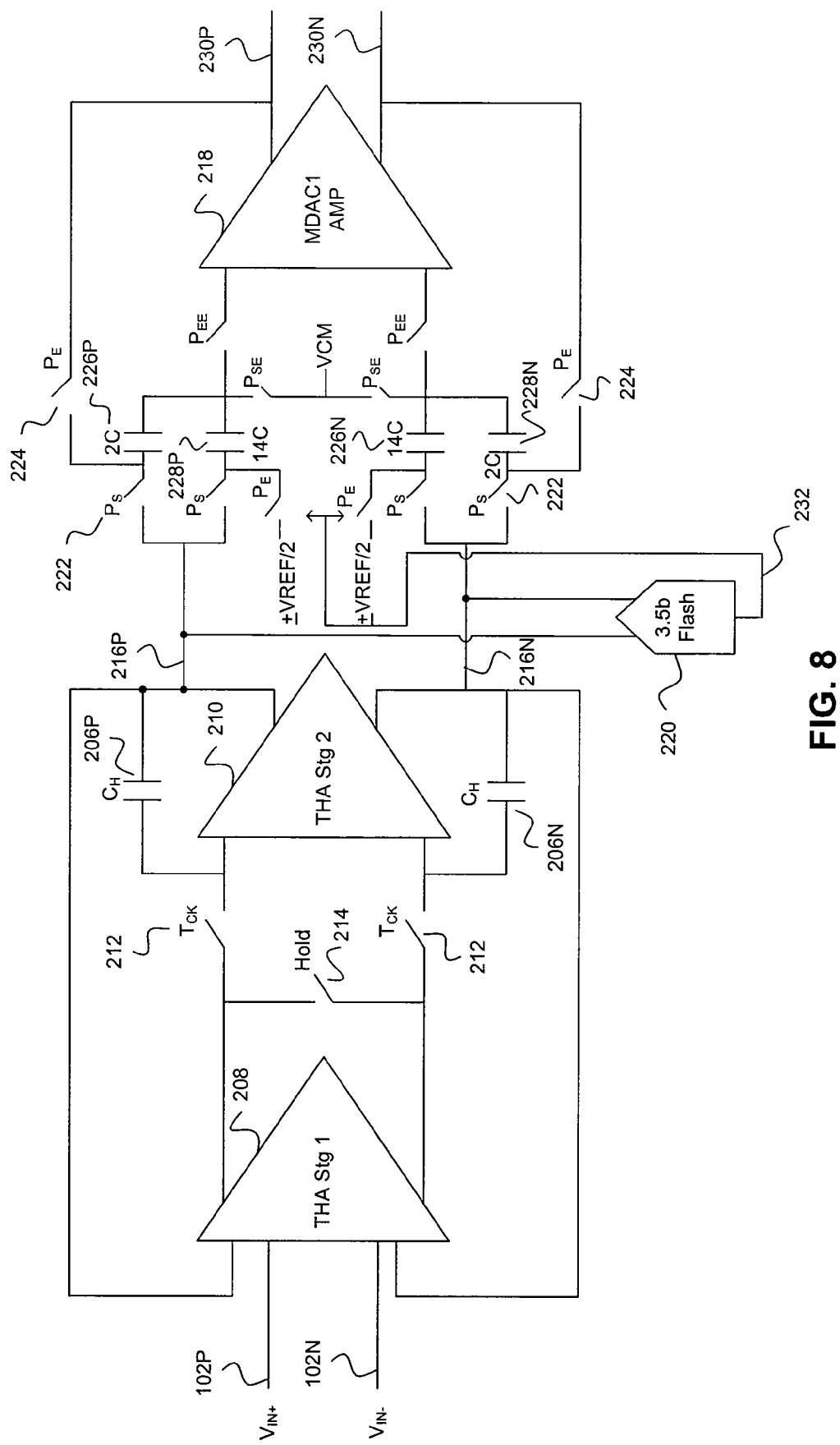

FIG. 8 illustrates a conventional differential implementation of THA and MDAC stages of a pipeline ADC.

The present invention will be described with reference to the accompanying drawings. Generally, the drawing in which an element first appears is typically indicated by the leftmost digit(s) in the corresponding reference number.

DETAILED DESCRIPTION OF EMBODIMENTS

Figure 1:
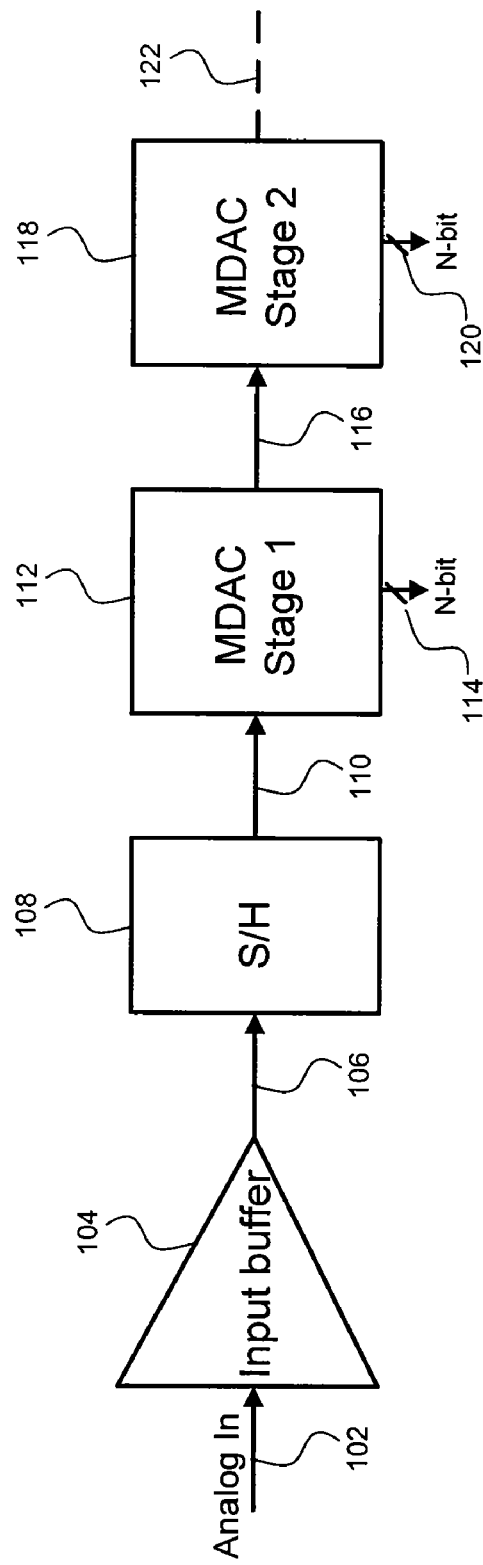
FIG. 1 is a block diagram that illustrates a conventional pipeline ADC architecture.

FIG. 1 is a block diagram that illustrates a conventional pipeline ADC architecture 100. As shown in FIG. 1, pipeline ADC architecture 100 includes an input buffer 104, a sample-and-hold (S/H) circuit 108, and a plurality of pipelined multiplying digital-to-analog converter (MDAC) stages, including MDAC stage 112 and MDAC stage 118.

Input buffer 104 receives an analog input signal 102. Input signal 102 is a continuous-time waveform. Similarly, output signal 106 of input buffer 104 is a continuous-time waveform. Typically, input buffer 104 is optionally used in order to create a buffer between front-end circuitry of the ADC architecture (i.e., programmable gain amplifier (PGA)) and the large switched capacitor load generally present in S/H circuit 118. This buffer allows for less stringent drive requirements of the front-end circuitry.

S/H circuit 108 receives signal 106 of input buffer 104, samples signal 106, and outputs a sampled analog value 110 to MDAC stage 112. It is noted that S/H circuit 108 holds sampled analog value 110 steady for a short period of time in order for MDAC stage 112 to operate on the sampled analog value.

MDAC stage 112 operates on sampled analog value 110 to generate a N-bit output 114 and a residue signal 116. N-bit output 114 represents a N-bit coarse quantization of sampled analog value 110. Residue signal 116 is generated by subtracting the analog equivalent of the digital output 114 from sampled analog value 110. Generally, MDAC stage 112 further includes an amplifier, which gains up residue signal 116 before outputting it to the next MDAC stage 118.

MDAC stage 118 operates similarly to MDAC stage 112, generating a N-bit output 120 representing a N-bit coarse quantization of signal 116 and a residue signal 122, generated by subtracting the analog equivalent of output 120 from signal 116.

Operation of pipeline ADC 100 continues as described above, outputting N bits and a residue signal per MDAC stage until a final residue signal reaches a terminal flash ADC (not shown in FIG. 1), which quantizes and outputs a quantized representation of the final residue signal. Subsequently, the N-bit outputs of the MDAC stages and the output from the terminal flash ADC (all corresponding to the same sampled analog value 110) are time-aligned and input into a digital error correction circuit, which combines the outputs to generate a high accuracy digital representation of the sampled analog value.

It is noted that when an MDAC stage of pipeline ADC 100 finishes processing an analog sample and passes the residue to the next stage, it can then start processing a subsequent analog sample. This enables high throughput ADC conversion using pipeline ADC architecture 100.

Commonly, input buffer 104 and S/H circuit 108 are replaced by a single track-and-hold amplifier (THA) stage in order to save power and area. The THA stage does not include any switched capacitor load. Therefore, the THA stage presents almost a static load to the front-end circuitry of the ADC architecture. Accordingly, settling requirements of the front-end circuitry can be reduced, and a circuit block can be eliminated in the ADC architecture.

Figure 2:
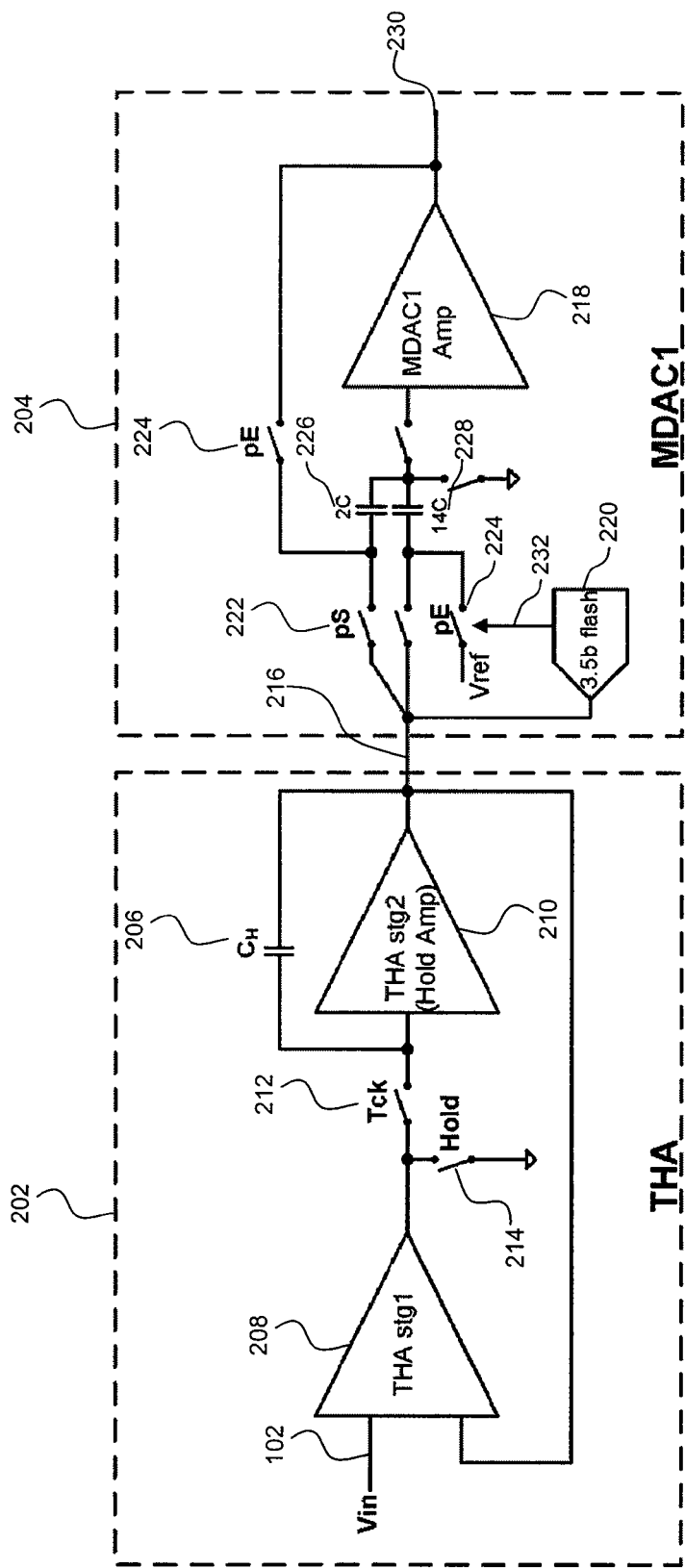
FIG. 2 illustrates a conventional implementation of track-and-hold amplifier (THA) and multiplying digital-to-analog converter (MDAC) stages of a pipeline ADC.

FIG. 2 illustrates an example conventional implementation 200 of track-and-hold amplifier (THA) and multiplying digital-to-analog converter (MDAC) stages of a pipeline ADC. Conventional implementation 200 shows a THA stage 202 coupled to a first MDAC stage 204 of a pipeline ADC architecture.

As shown in FIG. 2, THA stage 202 include an input stage 208, an output stage 210, and a holding capacitor $C_H$ 206. Input stage 208 is configured to receive an analog input signal Vin 102. Output stage 210 is configured to output a sampled analog voltage 216. THA stage 202 further includes a track switch "Tck" 212 and a hold switch "Hold" 214. When track switch 212 is closed, THA stage 202 is continuously monitoring input signal Vin 102. When track switch 212 opens, a sampled analog value of input signal Vin 102 is stored on holding capacitor 206, and input stage 208 is reset by closing hold switch 214. In the hold state, sampled analog voltage 216 is ready for sampling by MDAC stage 204.

MDAC stage 204 includes an amplifier 218, a 3.5 bit flash ADC 220, and a plurality of sampling capacitors, including sampling capacitors 226 and 228. As would be understood by a person skilled in the art based on the teachings herein, implementations are not limited to the example implementation provided in FIG. 2. Accordingly, different configurations of flash ADC 220 (i.e., bit resolution) and sampling capacitors 226 and 228 (i.e., layout and/or capacitance values) may be used. It is noted that, as implemented in FIG. 2, sampling capacitors 226 and 228 are configured to provide a gain of 8. Further, although a single-ended configuration is shown, both single-ended and differential configurations may be used.

In addition, MDAC stage 204 includes sampling switches "pS" 222 and evaluation switches "pE" 224.

When THA stage 202 enters a hold phase, MDAC stage 204 enters a sampling phase. During a sampling phase, sampling switches 222 are closed, and sampled voltage 216 is stored across sampling capacitors 226 and 228. Simultaneously, sampled voltage 216 is quantized by flash ADC 220 to generate a coarse quantization output 232. Generally, output 232 is a digital signal of pre-determined resolution.

During an evaluation phase, evaluation switches 224 are closed. Thus, sampling capacitors 226 become coupled to the output of amplifier 218. Simultaneously, each capacitor of sampling capacitors 228 is independently coupled either to ground or to a reference voltage Vref depending on the value of coarse quantization output 232. For example, if sampled voltage 216 is very high (i.e., very close to the full scale voltage), output 232 will be equal to "111." Accordingly, every capacitor of sampling capacitors 228 will be coupled to Vref, and a voltage equal to Vref will be subtracted from sampled voltage 216 to generate residue voltage 230 (after multiplication by the gain factor of amplifier 218). On the other hand, if sampled voltage 216 was equal to zero, then output 232 will be equal to "000." Accordingly, every capacitor of sampling capacitors 228 will be coupled to ground, and zero voltage will be subtracted from sampled voltage 216 to generate residue voltage 230.

In an implementation, in order to perform the above described subtraction operation, each capacitor of sampling capacitors 228 is coupled to a separate switch, which couples the capacitor either to ground or Vref depending on flash ADC output 232. In an embodiment, flash ADC output 232 is a multi-bit signal that controls each separate switch independently.

FIG. 8 illustrates a conventional differential implementation 800 of THA and MDAC stages of a pipeline ADC. Differential implementation 800 is similar to single-ended implementation 200 of FIG. 2.

The THA stage includes an input stage 208, an output stage 210, and holding capacitors 206P and 206N.

Input stage 208 is configured to receive differential analog input signals Vin+ 102P and Vin− 102N. Output stage 210 is configured to output sampled differential analog voltages 216P and 216N. The THA stage further includes track switches "Tck" 212 and a hold switch "Hold" 214. When track switches 212 are closed, the THA stage is continuously monitoring input signals Vin+ 102P and Vin− 102N. When track switches 212 open, sampled analog values of input signals Vin+ 102P and Vin− 102N are stored respectively on holding capacitors 206P and 206N, and input stage 208 is reset by closing hold switch 214. In the hold state, sampled analog voltages 216P and 216N are ready for sampling by the MDAC stage.

The MDAC stage includes an amplifier 218, a 3.5 bit flash ADC 220, and a plurality of sampling capacitors, including sampling capacitors 226P, 228P and 226N, 228N. As would be understood by a person skilled in the art based on the teachings herein, implementations are not limited to the example implementation provided in FIG. 8. Accordingly, different configurations of flash ADC 220 (i.e., bit resolution) and sampling capacitors 226 and 228 (i.e., layout and/or capacitance values) may be used. It is noted that, as implemented in FIG. 8, sampling capacitors 226 and 228 are configured to provide a gain of 8.

When the THA stage enters a hold phase, the MDAC stage enters a sampling phase. During a sampling phase, sampling switches 222 are closed, and sampled voltages 216P and 216N are stored respectively across sampling capacitors 226P, 228P and 226N, 228N. Simultaneously, sampled voltages 216P and 216N are quantized by flash ADC 220 to generate a coarse quantization output 232. Generally, output 232 is a digital signal of pre-determined resolution.

During an evaluation phase, evaluation switches 224 are closed. Thus, sampling capacitors 226P and 226N become coupled to the output of amplifier 218. Simultaneously, each capacitor of sampling capacitors 228P and 228N is independently coupled either to −Vref/2 or +Vref/2 depending on the value of coarse quantization output 232. For example, if sampled voltage 216 (difference of 216P and 216N) is very high (i.e., very close to the full scale voltage), output 232 will be equal to "0111 (+7)." Accordingly, every capacitor of sampling capacitors 228P will be coupled to +Vref/2 and every capacitor of sampling capacitors 228N will be coupled to −Vref/2, and a voltage equal to 14*Vref/16 will be subtracted from sampled voltage 216 to generate differential residue voltages 230P and 230N (after multiplication by the gain factor of amplifier 218 in evaluation phase configuration). On the other hand, if sampled voltage 216 was equal to zero, then output 232 will be equal to "0000 (0)." Accordingly, half of sampling capacitors 228P will be coupled to +Vref/2 and the other half will be coupled to −Vref/2. Similarly, half of sampling capacitors 228N will be coupled to +Vref/2, and the other half will be coupled to −Vref/2, and zero voltage will be subtracted from sampled voltage 216 to generate differential residue voltages 230P and 230N (after multiplication by the gain factor of amplifier 218 in evaluation phase configuration).

In an implementation, in order to perform the above described subtraction operation, each capacitor of sampling capacitors 228P and 228N is coupled to a separate switch, which couples the capacitor either to −Vref/2 or +Vref/2 depending on flash ADC output 232.

Generally, in order to achieve good noise performance in THA stage 202, holding capacitor $C_H$ 206 needs to be considerably larger than sampling capacitors 226 and 228 of MDAC stage 204. In addition, THA amplifiers require high bandwidth and high slew rate to achieve good linearity performance. As a result, the THA stage consumes a large fraction of ADC power and is also one of the main circuit area contributors. In addition, because the THA stage is located at the front-end of the ADC and needs to drive a large switched-capacitor load, the THA stage remains the major noise and distortion contributor in the ADC architecture.

Embodiments of the present invention provide novel architectures directed at reducing the overall ADC area and power consumption. In particular, embodiments of the present invention enable reusing the holding capacitor of the THA stage for MDAC operation, thereby resulting in area and power savings. In addition, embodiments of the present invention enable reuse of part of or the whole of the THA stage amplifier for the MDAC stage amplifier. Further, embodiments enable eliminating one charge transfer event from the ADC architecture, resulting in less sampling noise and power savings. As will be understood by a person skilled in the art based on the teachings herein, embodiments of the present invention are not limited to pipelined ADCs, but may also be used for cyclic ADCs and successive approximation (SAR) ADCs, for example. Further, although single-ended configurations are described herein, embodiments of the present invention may be implemented using both single-ended and differential configurations.

Figure 3:
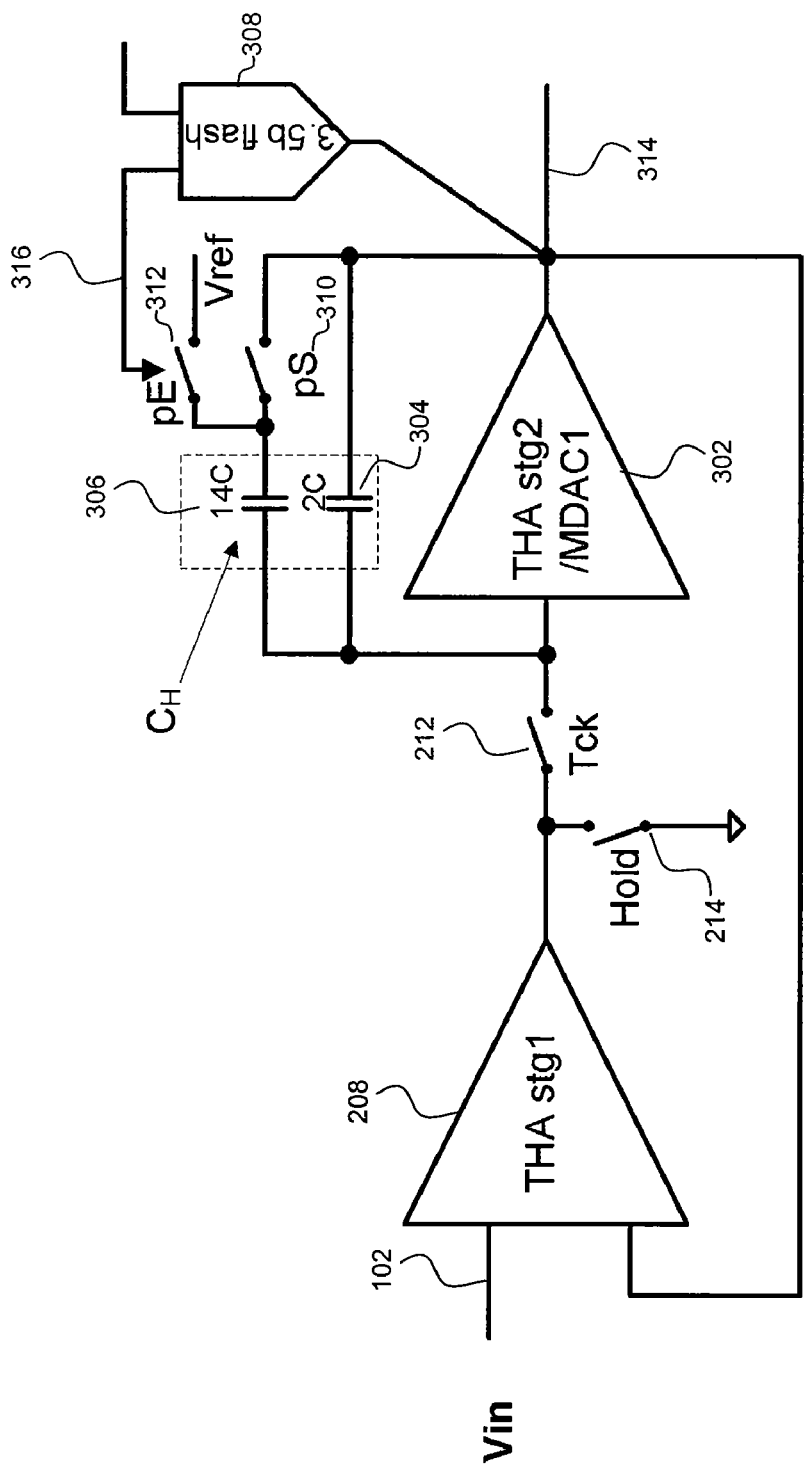
FIG. 3 illustrates an example shared THA/MDAC stage implementation according to an embodiment of the present invention.

FIG. 3 illustrates an example shared THA/MDAC stage implementation 300 according to an embodiment of the present invention. Shared THA/MDAC stage implementation 300 merges the THA stage and the first MDAC stage by reusing certain components, thereby resulting in reduced overall ADC area and power consumption. In particular, as shown in FIG. 3, the second stage or output stage of the THA (referred to using reference numeral 210 in FIG. 2) is reused as the amplifier for the first MDAC stage (referred to using reference numeral 218 in FIG. 2) to form THA/MDAC amplifier stage 302. Further, the holding capacitor of the THA stage (referred to using reference numeral 206 in FIG. 2) is reused as the sampling capacitors for the MDAC stage (referred to using reference numerals 224 and 226) to form shared holding/sampling capacitors 304 and 306. In an embodiment, the holding capacitor of the THA stage is implemented using 16 unit capacitors for a 3.5 bits/stage MDAC operation.

In an embodiment, as illustrated in FIG. 3, a 3.5 bits flash ADC 308 is coupled to the output of THA/MDAC amplifier stage 302. A sampling switch "pS" 310 couples holding/sampling capacitors 306 to the output 314 of THA/MDAC stage 302 during track and hold phases of operation. In an embodiment, a similar switch couples holding/sampling capacitors 304 to the output 314 of THA/MDAC stage 302 during track and hold phases of operation. During evaluation phases, an evaluation switch "pE" 312 couples holding/sampling capacitors 306 to either ground or Vref depending on the output 316 of flash ADC 308.

Operation of shared implementation 300 will now be described with reference to FIGS. 4A-4C. FIG. 4A illustrates circuit configuration of shared implementation 300 during a track phase of operation. As shown in FIG. 4A, during a track phase, track switch "Tck" 212 and sampling switch "pS" 310 are closed. Hold switch "Hold" 214 and evaluation switch "pE" 312 on the other hand are open. Accordingly, the circuit (THA stage 208 and THA/MDAC stage 302) is configured as a unity-gain buffer to track input signal Vin 102.

FIG. 4B illustrates circuit configuration of shared implementation 300 during a hold phase of operation. As shown in FIG. 4B, during a hold phase, track switch "Tck" 212 is open, and hold switch "Hold" 214 is closed. Sampling switch "pS" 310 remains closed and evaluation switch "pE" 312 remains open. Accordingly, input signal Vin 102 is sampled and held on holding/sampling capacitors 304 and 306 across THA/MDAC stage 302, which is configured in this phase as a hold amplifier. Simultaneously, flash ADC 308 performs a coarse quantization of the sampled voltage held on capacitors 304 and 306.

After a hold phase, an evaluation phase follows. FIG. 4C illustrates circuit configuration of shared implementation 300 during an evaluation phase. As shown in FIG. 4C, during an evaluation phase, track switch "Tck" 212 and hold switch "Hold" 214 maintain the same states as in a hold state. However, sampling switch "pS" 310 is now open and evaluation switch "pE" 312 is closed. When that occurs, holding/sampling capacitors 306 are selectively coupled individually (via associated switches not shown in FIG. 4C) to either ground or Vref depending on output signal 316 of flash ADC 308. This selective coupling causes a corresponding amount of electrical charge to be subtracted from the initial charge held across capacitors 304 and 316, resulting in a residual charge (voltage) across capacitors THA/MDAC stage 302. During this phase, THA/MDAC stage 302 is configured as an MDAC amplifier.

Subsequently, the circuit returns to a track phase to process a next sample of input signal Vin 102.

It is noted that, according to the above described circuit operation, explicit MDAC stage sampling is eliminated because the input signal is already sampled onto holding/sampling capacitors 304 and 306 at the end of the track phase. As a result, sampling noise associated with MDAC stage sampling and loading caused by large MDAC sampling capacitors are eliminated.

In example shared implementation 300, the first stage or input stage 208 of the THA is idle during hold and evaluation phases. Thus, assuming that track, hold, and evaluation phases have equal durations, input stage 208 has a duty cycle of 1/3. According to other embodiments of the present invention, a time-interleaved architecture can be used in order to increase the duty cycle of input stage 208.

An example time-interleaved architecture 500 of a shared THA/MDAC stage implementation according to an embodiment of the present invention is illustrated in FIG. 5. As shown in FIG. 5, time-interleaved architecture 500 includes an input (THA) stage 208 and a plurality of time-interleaved shared THA/MDAC stages, including shared THA/MDAC stages 502 and 504.

Shared THA/MDAC stages 502 and 504 operate as described above with respect to example shared implementation 300. However, as shown in FIG. 5, shared stages 502 and 504 have separately controlled track, sampling, and evaluation switches. As a result, THA/MDAC stages 502 and 504 may have time-independent track, hold, and evaluation phases.

In an embodiment, THA/MDAC stages 502 and 504 are operated such that the track phase of one stage coincides with the evaluation phase of the other stage, and vice versa. In other words, while one stage performs an evaluation phase, the other stage performs a track phase. Accordingly, input stage 208 can be time-shared between stages 502 and 504, remaining idle only during the hold phases of THA/MDAC stages 502 and 504. Thus, assuming that track, hold, and evaluation phases have equal durations, input stage 208 will have a duty cycle of 2/3. In an embodiment, the track, hold and evaluation phases are of equal duration, and architecture 500 is extended to have one input stage 208 drive three THA/MDAC stages in a time-interleaved fashion. In another embodiment, the evaluation phase is twice the duration of the track or hold phase, and architecture 500 is extended to have one input stage 208 drive four THA/MDAC stages, resulting in four times the throughput of the implementation of FIG. 3.

FIGS. 6A-6B illustrate example shared THA/MDAC implementations according to embodiments of the present invention. In particular, in example implementation 600A of FIG. 6A, input (THA) stage 208 (which previously was implemented as a follower circuit) is replaced with a resistive structure, including resistors 602 and 604. According to this implementation, THA/MDAC stage 302 is used during every phase (i.e., track, hold, evaluation) of operation. In an embodiment, in track phase, track switch "Tck" 212 is closed, and THA/MDAC stage 302 operates as an inverting amplifier having a closed-loop gain equal to a ratio of resistors 604 and 602. As in FIG. 4A, sampling switch "pS" is also closed during the track phase, resulting in the amplified input voltage Vin 102 to appear across holding/sampling capacitors 304 and 306. Then, during the hold phase, track switch "Tck" 212 is opened and hold switch "Hold" 214 is closed. Sampling switch "pS" 310 remains closed, and the amplified input voltage is held to an instantaneous value across capacitors 304 and 306. Thus, THA/MDAC stage 302 operates as a holding amplifier in the hold phase. Finally, in the evaluation phase, sampling switch "pS" 310 is opened and evaluation switch "pE" 312 is closed. Electric charge is subtracted from the initial charge held on capacitors 304 and 306 according to the output 316 of flash ADC 308. In the evaluation phase, THA/MDAC stage 302 operates as an MDAC amplifier.

It is noted that by using a resistive structure as in example implementation 600A, the inputs of THA/MDAC stage 302 will not see the entire signal swing as seen by input stage 208 in FIG. 3, resulting in improved overall linearity and distortion performance of the ADC.

FIG. 6B illustrates another example shared THA/MDAC implementation 600B according to an embodiment of the present invention. Example implementation 600B is similar to example implementation 600A described above. However, instead of using a resistive structure, example implementation 600B uses a capacitive structure, including input capacitor Cin 606, to determine the closed-loop gain during track mode. Operation of example implementation 600B is similar to the operation of example implementation 600A, and will not be described herein. Generally, selecting between the different example implementations described above may depend on the nature of the input circuitry driving the ADC.

FIG. 7 illustrates an example dual-channel pipeline IQ ADC architecture 700 with shared THA/MDAC stage implementation. Example architecture 700 may be used in wireless systems, in which a dual-channel IQ ADC is needed in order to process I and Q channel signals.

As shown in FIG. 7, example architecture 700 includes a first MDAC stage, including THA-THA/MDAC stages 706I and 706Q, and a shared second MDAC stage, including a Ping-Pong MDAC 716. THA-THA/MDAC stages 706I and 706Q each comprises a THA stage (such as THA stage 208, for example) and a shared THA/MDAC stage (such as THA/MDAC stage 302, for example), and can be implemented using any of the THA and shared THA/MDAC implementations described above. Operation of stages 706I and 706Q is also as described above. For example, THA-THA/MDAC stage 706I processes I channel input 702 and coarse quantization output 712I of flash ADC 710I to generate a residual signal 708I. Similarly, THA-THA/MDAC stage 706Q processes Q channel input 704 and coarse quantization output 712Q of flash ADC 710Q to generate residual signal 708Q.

In an embodiment, stages 706I and 706Q are time-staggered with respect to each other, so that shared MDAC stage 716 can alternate between processing residual signals 708I and 708Q. For example, in an embodiment, in a first clock cycle, shared MDAC stage 716 processes residual signal 708I and output 714I (which is a coarse quantization of residual signal 708I) of flash ADC 710I to generate a second stage I channel residual signal. Then, in the following clock cycle, shared MDAC stage 716 processes residual signal 708Q and output 714Q (which is a coarse quantization of residual signal 708Q) of flash ADC 710Q to generate a second stage Q channel residual signal. In an embodiment, shared MDAC stage 716 includes first and second sets of holding/sampling capacitors (one set for each channel) and a single MDAC amplifier. The first set of capacitors samples residual signal 708I, and the second set of capacitors samples residual signal 708Q. The single MDAC amplifier is shared so that it alternates between evaluating the I channel residual signal and the Q channel residual signal.

Flash ADC 718 may be a terminal flash in example architecture 700 or used by a subsequent MDAC stage. In an embodiment, flash ADC 718 outputs a coarse quantization of the residual output of MDAC stage 716 at every clock cycle, alternating between I and Q data.

As will be understood by a person skilled in the art based on the teachings herein, embodiments of the present invention are not limited to pipelined ADCs, but may also be used for cyclic ADCs and successive approximation (SAR) ADCs, for example. Further, although single-ended configurations have been described herein, embodiments of the present invention include both single-ended and differential configurations.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An analog-to-digital converter (ADC), comprising:
   a track-and-hold amplifier (THA) stage; and
   a first shared THA/multiplying digital-to-analog converter (MDAC) stage, coupled to the THA stage;
   wherein the first shared THA/MDAC stage includes a plurality of holding-sampling capacitors.

2. The ADC of claim 1, wherein the THA stage and the first shared THA/MDAC stage are configured to operate as a unity gain buffer during a track phase of operation of the ADC.

3. The ADC of claim 1, wherein the first shared THA/MDAC stage is configured as a hold amplifier during a hold phase of operation of the ADC.

4. The ADC of claim 1, wherein the first shared THA/MDAC stage is configured as a MDAC amplifier during an evaluation phase of operation of the ADC.

5. The ADC of claim 1, further comprising:
   a flash ADC coupled to an output of the first shared THA/MDAC stage.

6. The ADC of claim 5, wherein the plurality of holding-sampling capacitors comprise a first set of holding-sampling capacitors and a second set of holding-sampling capacitors.

7. The ADC of claim 6, wherein the first set of holding-sampling capacitors are coupled between an input of the first shared THA/MDAC stage and an output of the shared THA/MDAC stage.

8. The ADC of claim 6, further comprising:
   a sampling switch that couples the second set of holding-sampling capacitors between an input of the first shared THA/MDAC stage and an output of the first shared THA/MDAC stage during track and hold phases of operation of the ADC.

9. The ADC of claim 6, further comprising:
   one or more evaluation switches that selectively couple each capacitor of the second set of holding-sampling capacitors to a first reference voltage or to a second reference voltage, depending on an output of the flash ADC.

10. The ADC of claim 1, further comprising:
    a second shared THA/MDAC stage, coupled to the THA stage;
    wherein the first shared THA/MDAC stage and the second shared THA/MDAC stage operate in a time-interleaved manner.

11. The ADC of claim 1, wherein the THA stage comprises first and second impedances, and wherein the first shared THA/MDAC stage operates as an inverting amplifier having a gain equal to a ratio of the first and second impedances during a track phase of operation of the ADC.

12. The ADC of claim 11, wherein the first and second impedances include resistors.

13. The ADC of claim 11, wherein the first and second impedances include capacitors.

14. The ADC of claim 1, wherein the ADC is a pipeline ADC.

15. The ADC of claim 1, wherein the ADC is a cyclic ADC.

16. The ADC of claim 1, wherein the ADC is a successive approximation (SAR) ADC.

17. The ADC of claim 6, further comprising:
    a sampling switch that couples the first set of holding-sampling capacitors between an input of the first shared THA/MDAC stage and an output of the first shared THA/MDAC stage during track and hold phases of operation of the ADC.

18. A dual-channel analog-to-digital converter (ADC), comprising:
    an in-phase (I) track-and-hold—track-and-hold/multiplying digital-to-analog converter (THA-THA/MDAC) stage;
    a quadrature phase (Q) THA-THA/MDAC stage;
    a first flash ADC, coupled to an output of the I THA-THA/MDAC stage;
    a second flash ADC, coupled to an output of the Q THA-THA/MDAC stage; and
    a shared MDAC stage that is selectively coupled to the output of the I THA-THA/MDAC stage or the Q THA-THA/MDAC stage.

19. The dual-channel ADC of claim 18, wherein the I THA-THA/MDAC stage is configured to process an I channel input and a coarse quantization output of the first flash ADC to generate a first I residual signal, and wherein the Q THA-THA/MDAC stage is configured to process a Q channel input and a coarse quantization output of the second flash ADC to generate a first Q residual signal.

20. The dual-channel ADC of claim 19, wherein the shared MDAC stage is configured to alternately process the first I residual signal and the first Q residual signal to generate respective second I and Q residual signals.

21. The dual-channel ADC of claim 20, further comprising:
    a third flash ADC, coupled to an output of the shared MDAC stage, configured to generate coarse quantizations of the respective second I and Q residual signals.

22. The dual-channel ADC of claim 18, wherein the I THA-THA/MDAC stage and the Q THA-THA/MDAC stage are time-staggered with respect to each other.

23. The dual-channel ADC of claim 18, wherein the ADC includes one of a pipeline ADC, a cyclic ADC, and a successive approximation (SAR) ADC.

24. The dual-channel ADC of claim 20, wherein the first flash ADC provides a coarse quantization of the first I residual signal to the shared MDAC stage, and wherein the second flash ADC provides a coarse quantization of the second residual signal to the shared MDAC stage.

25. The dual-channel ADC of claim 18, wherein the I THA-TRA/MDAC stage and the Q THA-THA/MDAC stage each comprises a THA stage and a shared THA/MDAC stage.

* * * * *